(12) United States Patent
Joshi et al.

(10) Patent No.: US 7,791,192 B1
(45) Date of Patent: Sep. 7, 2010

(54) CIRCUIT FOR AND METHOD OF IMPLEMENTING A CAPACITOR IN AN INTEGRATED CIRCUIT

(75) Inventors: Mukul Joshi, Sunnyvale, CA (US); Kumar Nagarajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/340,996

(22) Filed: Jan. 27, 2006

(51) Int. Cl.
*H01L 23/34* (2006.01)

(52) U.S. Cl. .................... 257/724; 257/499; 257/528; 257/523; 257/685; 257/704; 257/778; 257/E23.079; 257/E23.116; 257/E23.124; 257/E23.153; 257/E23.154; 438/108; 438/110; 438/111; 438/112

(58) Field of Classification Search .............. 257/724, 257/778, 499, 528, 532, 685, 704, E23.079, 257/E23.116, E23.124, E23.141, E23.154; 438/108, 110–112
See application file for complete search history.

(56) References Cited

U.S. PATENT DOCUMENTS

| | | | | |
|---|---|---|---|---|
| 4,617,479 A * | 10/1986 | Hartmann et al. | ...... | 365/185.17 |
| 5,798,567 A * | 8/1998 | Kelly et al. | ...... | 257/723 |
| 6,229,215 B1 * | 5/2001 | Egawa | ...... | 257/777 |
| 6,384,701 B1 * | 5/2002 | Yamada et al. | ...... | 333/247 |
| 6,661,100 B1 * | 12/2003 | Anderson et al. | ...... | 257/784 |
| 7,067,914 B2 * | 6/2006 | Malinowski et al. | ...... | 257/723 |
| 7,109,576 B2 * | 9/2006 | Bolken et al. | ...... | 257/686 |
| 2002/0086500 A1 * | 7/2002 | Wu et al. | ...... | 438/455 |
| 2002/0140085 A1 * | 10/2002 | Lee et al. | ...... | 257/724 |
| 2003/0033578 A1 * | 2/2003 | Chan et al. | ...... | 716/2 |
| 2004/0012085 A1 * | 1/2004 | Shioga et al. | ...... | 257/723 |
| 2004/0075170 A1 * | 4/2004 | Degani et al. | ...... | 257/724 |
| 2005/0258548 A1 * | 11/2005 | Ogawa et al. | ...... | 257/778 |

* cited by examiner

*Primary Examiner*—Lynne A Gurley
*Assistant Examiner*—Meiya Li
(74) *Attorney, Agent, or Firm*—John J. King

(57) ABSTRACT

An integrated circuit package has a substrate; a discrete capacitor coupled to a first surface of the substrate; an integrated circuit die coupled to the first surface of the substrate over the discrete capacitor; and a lid coupled to the substrate, the lid encapsulating the integrated circuit die and the discrete capacitor.

20 Claims, 7 Drawing Sheets

-- Prior Art --

-- Prior Art --

-- Prior Art --

CIRCUIT FOR AND METHOD OF IMPLEMENTING A CAPACITOR IN AN INTEGRATED CIRCUIT

FIELD OF THE INVENTION

The present application relates generally to integrated circuit packages, and in particular, to a circuit for and method of implementing a capacitor in an integrated circuit package.

BACKGROUND OF THE INVENTION

As the integrated circuits (ICs) continue to become smaller in size, and the circuitry on ICs continue to increase, the density of bonds and the number of bonds continue to increase. A ball grid array (BGA) is an advanced integrated circuit package comprising a substrate having contacts on the bottom for soldering the integrated circuit package to a circuit board. A wire bond BGA comprises a die having contact pads which are bonded to a contact pads on the surface of the substrate by way of wire bonds. In contrast, a flip chip BGA comprises a die having contact pads which are directly bonded to the substrate using solder bumps. Unlike in a wire bond BGA, the die having solder bumps is flipped over and placed face down in a flip chip BGA, with the solder bumps connecting directly to corresponding contact pads on the top surface of the substrate. The contact pads on the bottom of the substrate of either type of package are ultimately soldered to a circuit board.

Flip chip packages are particularly useful with devices requiring a large number of pins, such as programmable logic devices (PLDs). A PLD is an integrated circuit designed to be programmed by users so that users may implement logic designs of their choices. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA.

However, as both the density of the circuitry and the amount of circuitry for a given integrated circuit continues to increase, the noise associated with circuitry continues to increase. This unwanted noise is a particular problem in programmable logic devices because of the switching of digital circuits and high density of interconnect lines. In order for the circuit to operate properly, it is important to effectively control noise generated internally from digital switching. One way to control such noise is through the use of decoupling capacitors. As shown for example in the conventional integrated circuit package 102 of FIG. 1 having an integrated circuit die 104 (and the cross-sectional view of FIG. 2 taken at lines 2-2), the decoupling capacitors 106 and 108 are positioned on the substrate on the sides of the integrated circuit die 104, which has dimensions $w_2$ and $l_2$. Although the decoupling capacitors are shown on two sides of the integrated circuit die, the decoupling capacitors may be positioned on any number of sides, including all four sides, therefore affecting the overall size of the integrated circuit package by affecting both dimension $W_1$ and $L_1$.

The goal of decoupling is to provide a low impedance path between the point in the supply system where a logic element on the integrated circuit draws the current needed to operate and its local ground contact, forming the return path for current to the power supply. Placing a capacitor in close proximity to the power and ground contacts on the integrated circuit takes RF energy generated by rapid changes of current demand on the power supply during switching, and then channels it to the ground return path. The use of decoupling capacitors prevents power line channeled noise from subverting normal circuit operation. Because uncontrolled power supply noise has many effects, such as intermodulation and crosstalk, it is important to reduce noise whenever possible in digital circuits.

However, decoupling capacitors themselves may cause undesirable affects in the circuit. Decoupling capacitors are typically placed on periphery of the substrate, typically as close to the integrated circuit die as possible. In an integrated circuit package, a flip chip with solder bumps 201 having a height $h_1$ is positioned on a substrate 202 which is coupled to a lid 204. The inside of the lid extends a height $h_2$ from the substrate, resulting in an overall height of $h_3$ for the integrated circuit package. As can also be seen in the bottom plan view of the integrated circuit die of FIG. 3, the solder bumps 201 are evenly positioned over the entire area of the die. The proximity of the capacitors from the integrated circuit die 104 is constrained by the die size and the underfill 206. The conducting metal lines in the substrate connect the capacitors and the power/ground pins of the chip. The inductance of these metal lines is directly proportional to the length of the conductive path. As can be seen in FIG. 2, the conductor 208 from a power or ground contact 210 of the die to the decoupling capacitor 106 may be particularly long. Even when the power or ground contact on the die is on the end of the die, the line may be relatively long, as shown by conductor 212 connecting contact 214 to the decoupling capacitor 108. Accordingly, the benefits of placing capacitors on the substrate to minimize the simultaneous switching noise (SSO) between the power/ground planes is overshadowed by the inductance of the conductive path between the capacitor and the integrated circuit die.

Therefore, there is a need for an improved circuit for and method of implementing capacitors, such as discrete decoupling capacitors, in an integrated circuit package to improve performance.

SUMMARY OF THE INVENTION

A method of implementing a capacitor in an integrated circuit package is described. The method comprises steps of coupling a capacitor to a first surface of a substrate of the integrated circuit package; coupling an integrated circuit die to the first surface of the substrate over the capacitor; and attaching a lid to the substrate, wherein the lid encapsulates the integrated circuit die and the capacitor. The step of coupling an integrated circuit die to a substrate may comprise coupling a flip chip die having a plurality of solder bumps to contacts on the substrate. Further, the step of coupling a capacitor to conductors of the substrate may comprise a step of coupling the capacitor to a power plane or a ground plane of the substrate.

According to an alternate embodiment of implementing a capacitor in an integrated circuit package, a method comprises steps of coupling a capacitor to a first surface of a substrate of the integrated circuit package; positioning a flip chip die having a plurality of solder bumps on the substrate, the plurality of solder bumps creating separation between the bottom of the flip chip die and the capacitor; reflowing the plurality of solder bumps during an assembly reflow process; and maintaining separation between the bottom of the flip chip die and the capacitor after reflowing the plurality of solder bumps. The method preferably comprises a step of positioning a capacitor on the substrate near a power or ground contact of the substrate.

An integrated circuit package having a discrete capacitor is also disclosed. The integrated circuit package comprises a substrate; a discrete capacitor coupled to a first surface of the substrate; an integrated circuit die coupled to the first surface of the substrate over the discrete capacitor; and a lid coupled to the substrate, the lid encapsulating the integrated circuit die and the discrete capacitor. The integrated circuit die may comprise a flip chip die, for example, having a region with no solder bumps. The substrate may comprise a plurality of contacts for receiving the capacitor in a region corresponding to the region of the flip chip die with no solder bumps when the flip chip is coupled to the substrate. The plurality of contacts for receiving the capacitor may be positioned near a power contact or a ground contact of the substrate.

DETAILED DESCRIPTION OF THE DRAWINGS

Figure 1:
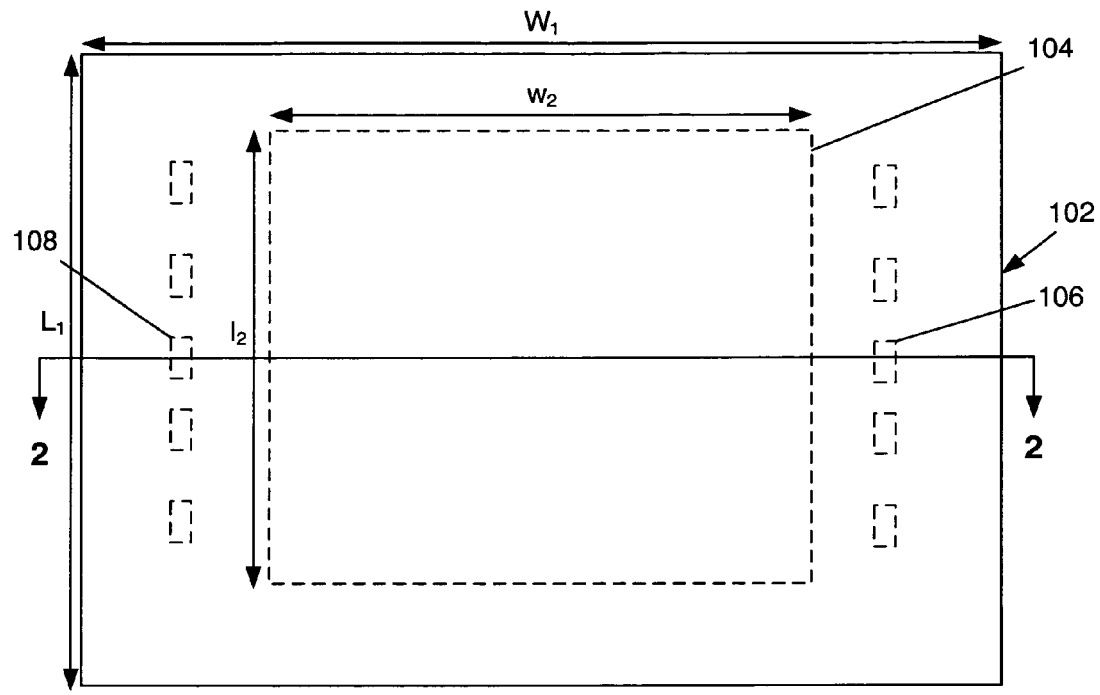
FIG. 1 is a top plan view of conventional integrated circuit package having an integrated circuit die and capacitors coupled to a substrate.
Figure 2:
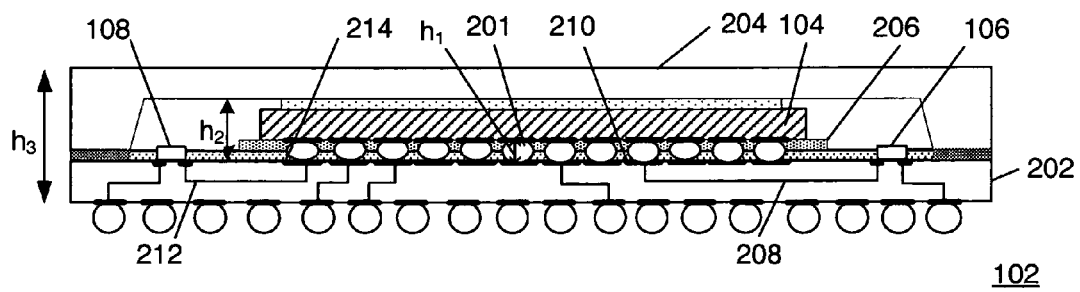
FIG. 2 is a cross-sectional view of the integrated circuit package of FIG. 1 taken at lines 2-2.
Figure 3:
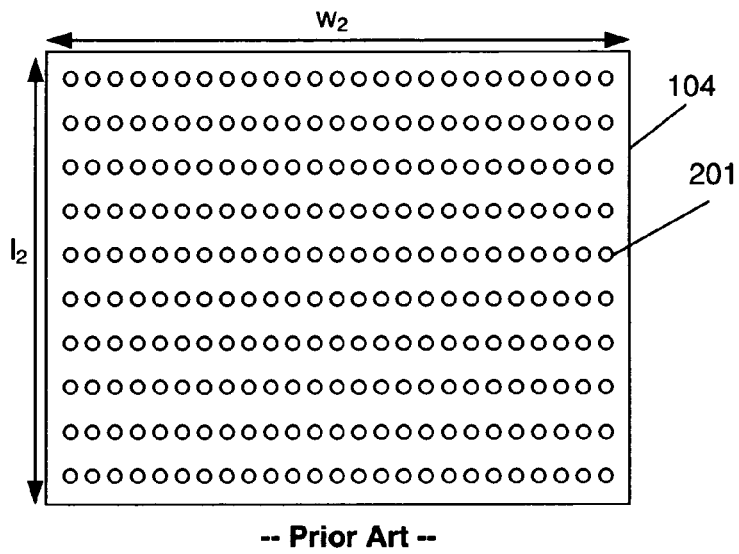
FIG. 3 is a bottom plan view of the integrated circuit die of the integrated circuit package of FIG. 1.
Figure 4:
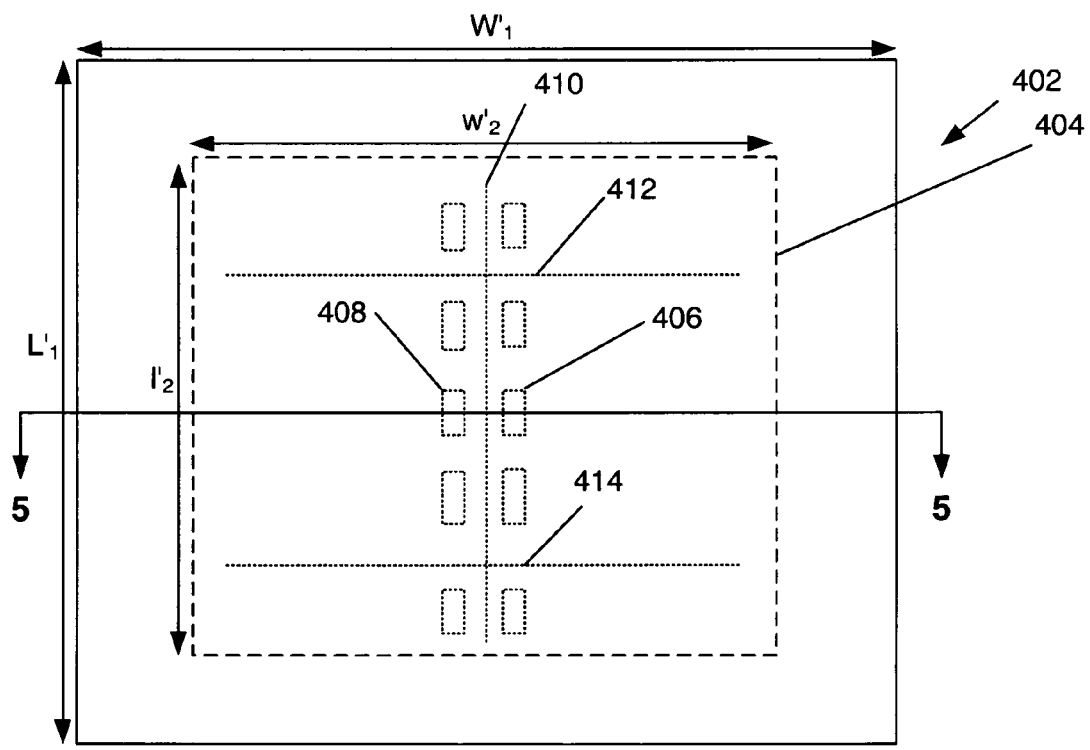
FIG. 4 is a top plan view of an integrated circuit package having an integrated circuit die and capacitors coupled to a substrate according to an embodiment of the present invention.

Turning first to FIG. 4, a top plan view of an integrated circuit package 402 having an integrated circuit die 404 and capacitors 406 and 408 coupled to a substrate according to an embodiment of the present invention is shown. As can be seen and will be described in more detail in reference to the cross section of FIG. 5, the capacitors are coupled to the substrate under the integrated circuit die. Also shown is a conductor 410 associated with the die, which may be for example a bus having a plurality of conductors including power and ground conductors, and the capacitors may be used as decoupling capacitors. The die may further include additional conductors 412 and 414 for routing signals, such as power and signals, to other parts of the integrated circuit die. Because the capacitors are positioned under the integrated circuit die, the width $W'_1$ of the overall integrated circuit package may be reduced compared to the width $W_1$ of the conventional circuit of FIG. 1. That is, the area of the substrate for receiving the decoupling capacitors is not necessary in the embodiment of FIG. 4.

By placing the decoupling capacitors closer to the power or ground conductors of the integrated circuit, the circuit of FIG. 4 further provides an enhanced electrical performance by reducing the distance from the decoupling capacitor and the power or ground contact on the substrate. According to one aspect of the circuit, the decoupling capacitors may be placed directly under the chip in as close proximity to a power or ground contact of the die as possible. Although the circuit of FIG. 4 shows the decoupling capacitors in the center of the die by way of example, the decoupling capacitors may be placed at any location under the die which will reduce the distance from a lead of the decoupling capacitor to a power or ground contact of the die. Also, although two rows of decoupling capacitors are shown, individual decoupling capacitors or other groups of capacitors may be employed at any location of the substrate near corresponding power and ground contacts on the die.

Figure 5:
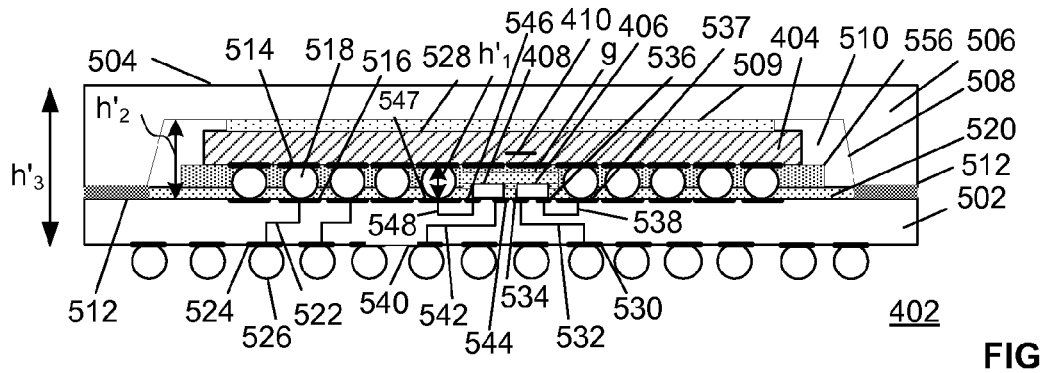
FIG. 5 is a cross-sectional view of the integrated circuit package of FIG. 4 taken at lines 5-5 according to an embodiment of the present invention.

Turning now to FIG. 5, a cross-sectional view of the integrated circuit package of FIG. 4 taken at lines 5-5 according to an embodiment of the present invention is shown. As shown in FIG. 5, a substrate 502 is coupled to receive a lid 504 comprising side walls 506 having an inner surface 508. An inner top surface 509 and the inner surface 508 form a recessed area 510 for encapsulating the integrated circuit die 404 and the capacitors 406 and 408. The lid 504 is coupled to the substrate by way of a bonding agent 512. The lid may be any type for conventional lid of an integrated circuit package, and may be a heat conductive material. The bonding agent may an adhesive material or a solder, or some other suitable material for attaching the lid to the substrate.

Contact pads 514 of the integrated circuit die are coupled to corresponding contact pads 516 on the substrate by solder bumps 518. High lead (Pb) solder bumps, which provide an increased gap (i.e., stand-off height) between the chip and the substrate, are preferably used to accommodate the height of the capacitors under the flip chip die. That is, high lead solder bumps do not shrink significantly during reflow, and therefore maintain the separation (designated as gap "g") from the bottom of the die and the capacitors. An example of high-Pb solder is solder having a composition of approximately 95 percent Pb and 5 percent tin (Sn). However, it should be understood that any solder or other conductive material that will maintain a gap between the die and the capacitors may be used. As can be seen in FIG. 5 and as will be described in more detail in reference to FIG. 9, a mask layer 520 is applied over the capacitors 406 and 408, filling at least a portion of the gap "g."

Also shown in FIG. 5 is the substrate conductors comprising a plurality of conductors extending from contact pads on the top of the substrate to contact pads on the bottom of the substrate. For example, a conductor 522 extends from the contact pad 516 to the contact pad 524 on the bottom of the substrate. Finally, solder balls 526 are positioned on the bottom of the substrate. Although some conductors and contacts of the substrate in the cross section of FIG. 5 are shown by way of example, many conductors connect the contact pads on the top of the substrate to contact pads on the bottom of the substrate according to substrate artwork created for the substrate. The substrate artwork defines the various conductors so that the proper connections are made from the contact pads of the integrated circuit die (by way of the solder bumps and contact pad on the top of the substrate) to the contacts on the bottom of the substrate.

According to one aspect of the embodiment of FIG. 5, the decoupling capacitors 406 and 408 are positioned near power or ground contacts of the integrated circuit die so that a conductor of the substrate connecting a lead of a decoupling capacitor to a power or ground contact of the integrated circuit die is minimized. For example, a first contact pad 530 on the bottom of the substrate is coupled by a conductor 532 to a contact pad 534 on the top of the substrate. The contact pad 534 is coupled to a lead of the capacitor 406. However, as can be seen, the contact pads for the capacitor 406 (and particularly the contact pad 536) are positioned so that the length of the conductive path 538 between the capacitor and a ground contact pad (e.g., contact pad 537) for the integrated circuit die associated with a ground contact of the integrated circuit also is minimized. Similarly, a second contact pad 540 on the bottom of the substrate is coupled by a conductor 542 to a contact pad 544 on the top of the substrate. The contact pad 544 is coupled to a lead of the capacitor 408. A contact pad 546 for the capacitor 408 is positioned so that the length of the conductive path 548 between the capacitor and a contact pad (e.g., contact pad 547) for the integrated circuit die associated with a power contact of the integrated circuit die is minimized. As described above, minimizing the length of the conductive path improves electrical performance. In contrast to the embodiment of FIG. 5 where the solder mask layer 520 covers the capacitors 406 and 408, openings or recesses may be created in the solder mask so that the capacitors having solder bumps may be coupled to the contact pads of substrate through the openings according to the alternate embodiment of FIG. 6. The formation of integrated circuit packages of FIGS. 5 and 6 will be described in more detail in reference to FIGS. 9 and 10.

Figure 6:
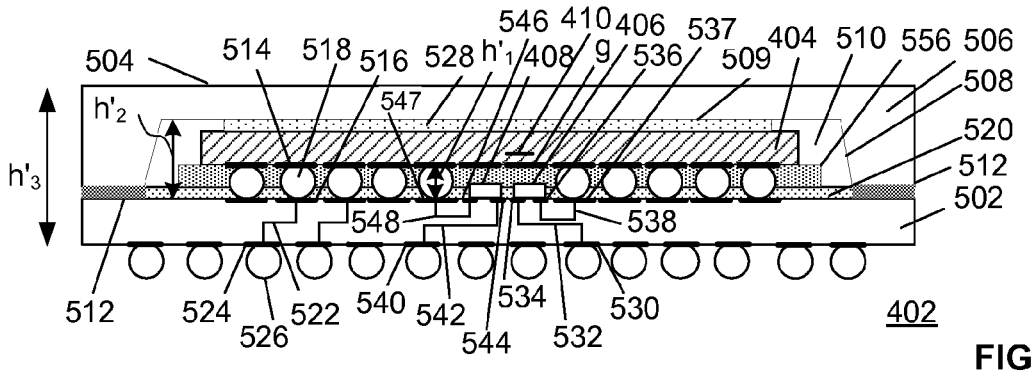
FIG. 6 is a cross-sectional view of the integrated circuit package of FIG. 4 taken at lines 5-5 according to an alternate embodiment of the present invention.
Figure 7:
FIG. 7 is a bottom plan view of the integrated circuit die of the integrated circuit package of FIG. 1 according to an embodiment of the present invention.

Turning now to FIG. 7, a bottom plan view of the die of the integrated circuit package of FIGS. 5 and 6 according to an embodiment of the present invention is shown. As is shown, the contact pads and solder bumps on a surface of the integrated circuit die are formed to accommodate the capacitors 406 and 408. In particular, substrate 404 comprises a first region 702 of solder bumps 518 and a second region 704 of solder bumps on either side of a region 706 having no solder bumps. That is, region 706 provides a recess for receiving the capacitors when the integrated circuit die is attached to the substrate. Although the two regions of solder bumps and the one recess are shown by way of example, any number of regions having no solder bumps, having any shape, may be formed such that decoupling capacitors on the substrate are positioned close to power and ground contacts on the integrated circuit die.

Figure 8:
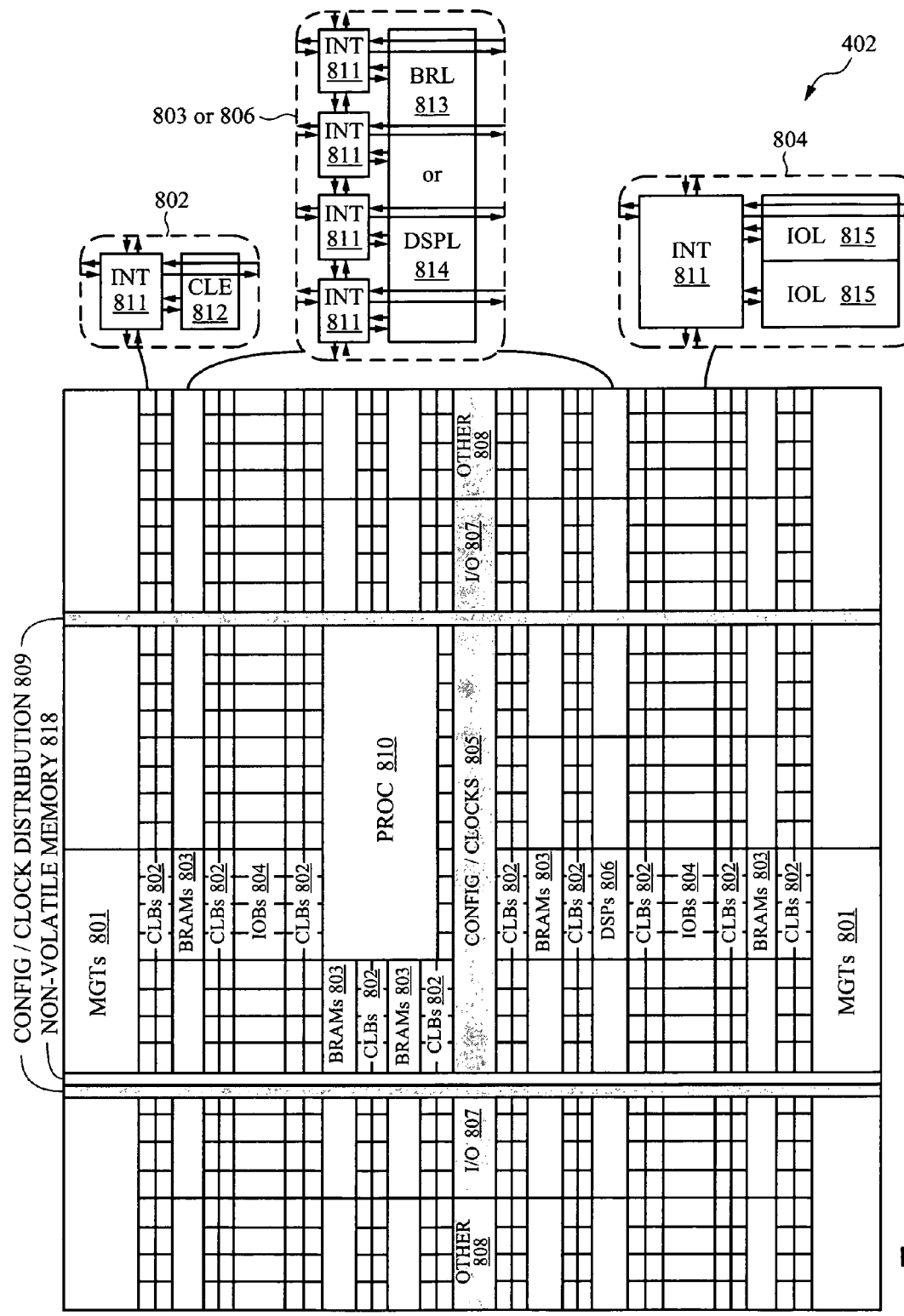
FIG. 8 is a block diagram of a programmable logic device implemented in an integrated circuit die of FIG. 6 according to an embodiment of the present invention.

Turning now to FIG. 8, a block diagram of a programmable logic device implemented in an integrated circuit die 402 and substrate 502 according to an embodiment of the present invention is shown. In particular, advanced FPGAs may include several different types of programmable logic blocks in the array. For example, FIG. 8 illustrates an FPGA architecture that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include one or more dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 812) that may be programmed to implement user logic plus a single programmable interconnect element (INT 811). A BRAM 803 may include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811). As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. Similarly the circuits and methods of the present invention may be implemented in any integrated circuit device, including any type of programmable logic device.

Turning now to FIG. 9, a series of figures shows the assembly of an integrated circuit package according to an embodiment of the present invention. In particular, a substrate 502 is formed comprising a plurality of contacts on the top surface and a plurality of contacts on the bottom surface, and conductors according to substrate artwork coupling predetermined contacts on the top surface to corresponding contacts on the bottom surface. Conductors 522, 532, 538, 542, and 548 described above are shown in FIG. 9a. Solder bumps of the capacitors 406 and 408 are coupled to corresponding contact pads 534 and 536 and contact pads 544 and 546, respectively, as shown in FIG. 9b. A mask layer 520 is then applied over the entire surface, including the capacitors 406 and 408, and the solder mask is etched to create openings for solder bumps of the integrated circuit die, as shown in FIG. 9c. The integrated circuit die is then attached to the substrate, as shown in FIG. 9d. The solder mask may be etched to retain portions of the material over the capacitors, as shown in the embodiment of FIG. 5. Alternatively, the solder mask may be etched to eliminate the material over the capacitors, resulting in the embodiment of FIG. 6.

Figure 9A:
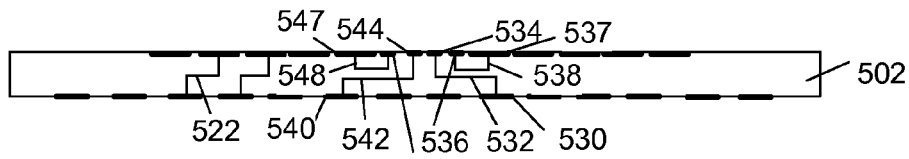
FIGS. 9a-9f is a series of figures showing the assembly of an integrated circuit package according to an embodiment of the present invention.
Figure 9B:
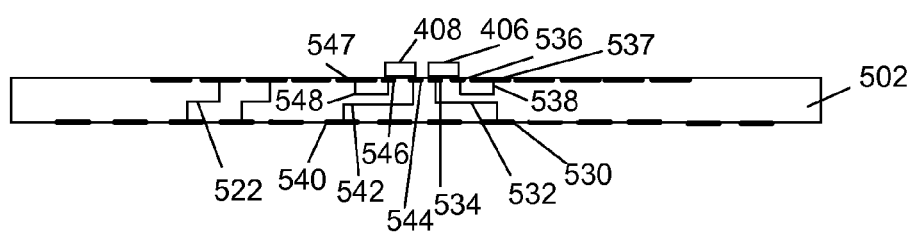
Figure 9C:
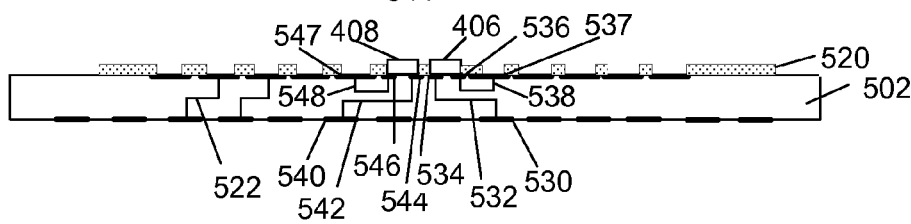
Figure 9D:
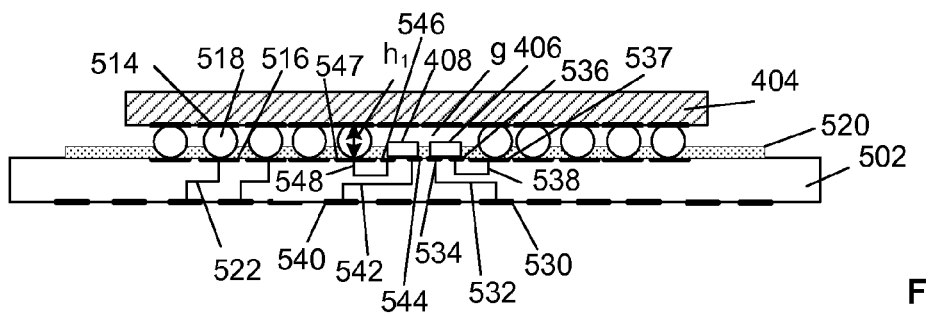
Figure 9E:
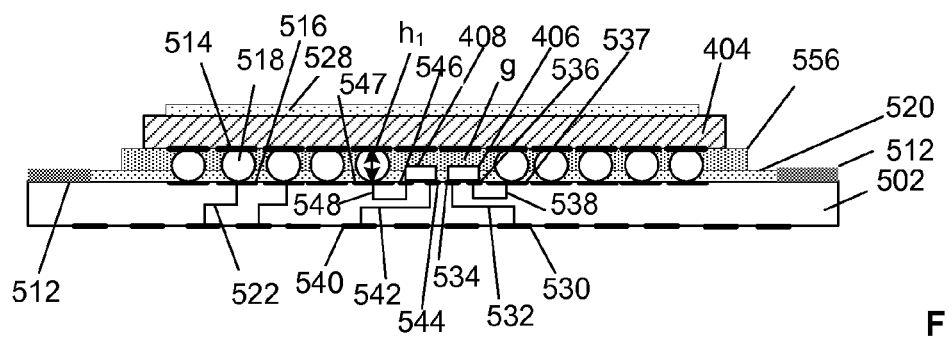
Figure 9F:
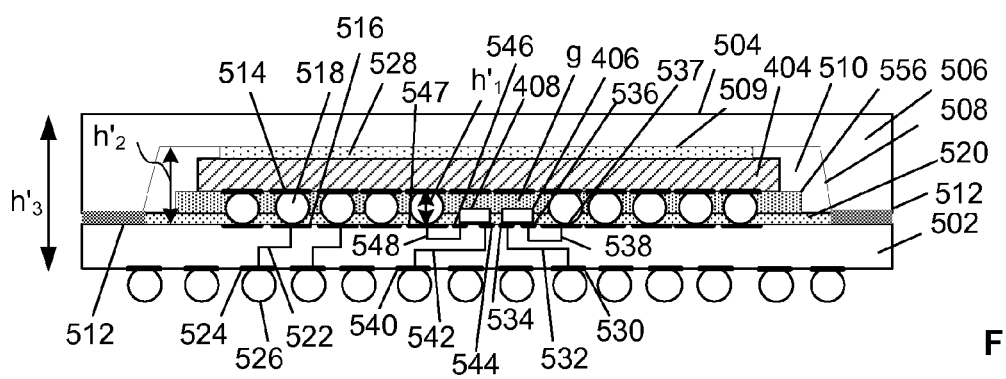
Figure 10A:
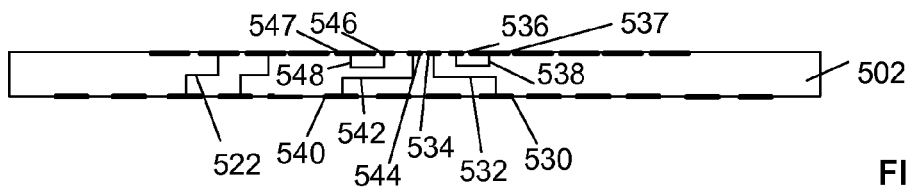
FIGS. 10a-10f is a series of figures showing the assembly of an integrated circuit package according to an alternate embodiment of the present invention.
Figure 10B:
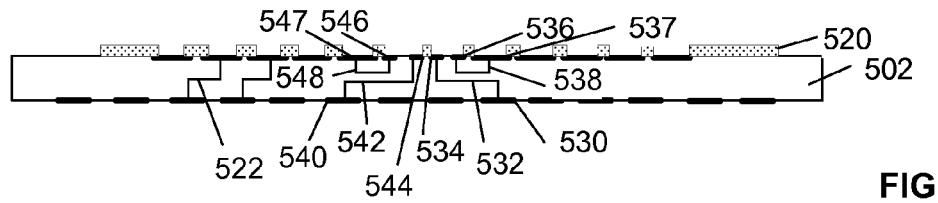
Figure 10C:
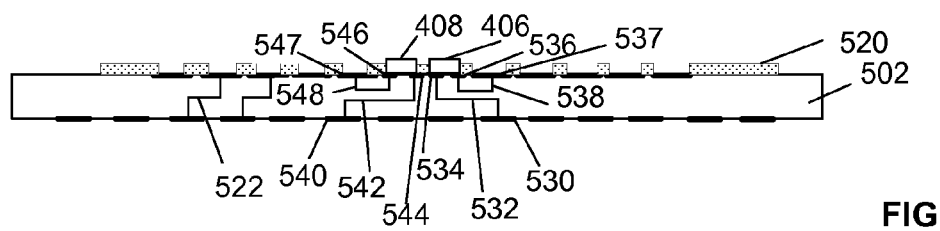
Figure 10D:
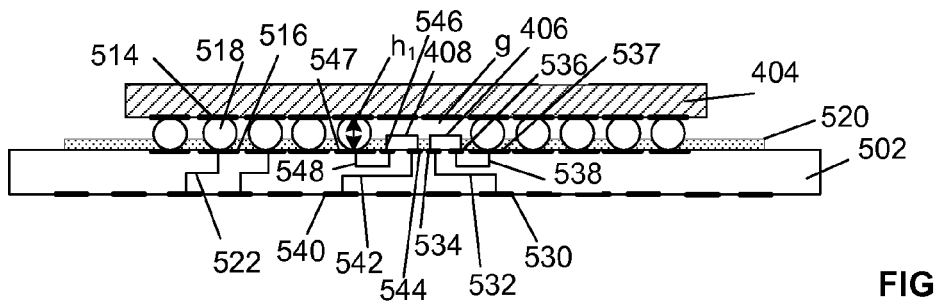
Figure 10E:
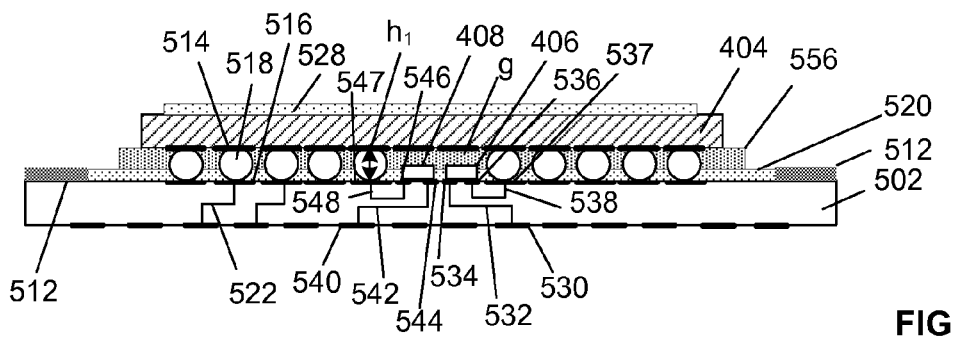
Figure 10F:
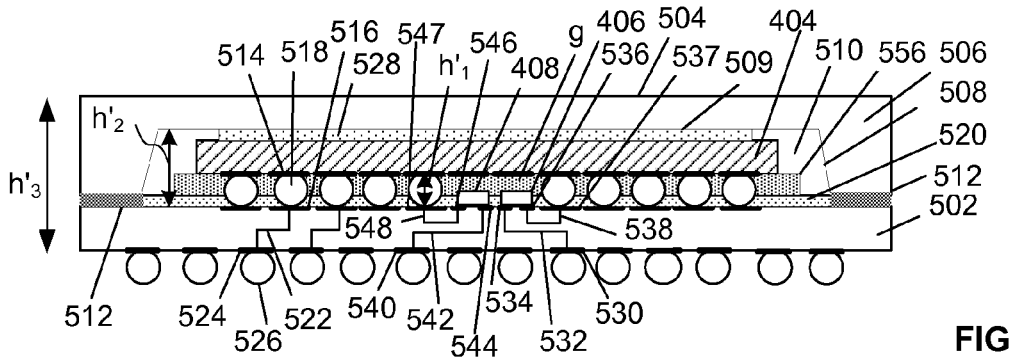

Remaining layers for creating the integrated circuit package are applied, as shown in FIG. 9e. For example, an underfill layer 556 and bonding agents for attaching the lid to the substrate may be applied. The bonding agents may include the adhesive 528 on the top of the integrated circuit die, and bonding agent 512 on the substrate for attaching a foot portion of the lid to the substrate. Alternatively, solder or some other suitable bonding agent may be used. Finally, the lid is attached to the bonding agent and solder balls are attached to contact pads on the bottom of the substrate, as shown in FIG. 9f. As can be seen, the gap "g" is maintained after any reflowing process for reflowing solder bumps used in the integrated circuit package. Although the height may change after reflowing, as indicated by the reduced height $h'_1$ (of FIG. 9f) compared to $h_1$ (of FIG. 9e), a gap is still maintained.

Turning now to FIG. 10, a series of figures show the assembly of an integrated circuit package according to an alternate embodiment of the present invention. According to the embodiment of FIG. 10 used to create the integrated circuit package shown in FIG. 6, the capacitors 406 and 408 are not attached until the solder mask layer 520 has been applied and etched, as shown in FIG. 10b. After the decoupling capacitors are attached (as shown in FIG. 10c) and the integrated circuit die is attached in FIG. 10d, the gap "g" is maintained by the solder bumps and filled with the underfill 556. By way of example, a chip capacitor may be approximately 300-400 microns in height. Accordingly, the solder balls must be selected to allow room for the capacitors, and preferably create a gap between the bottom of the die and the capacitors. The gap may be, for example, 50 microns, requiring the solder balls to create a height between 350-450 microns.

Figure 11:
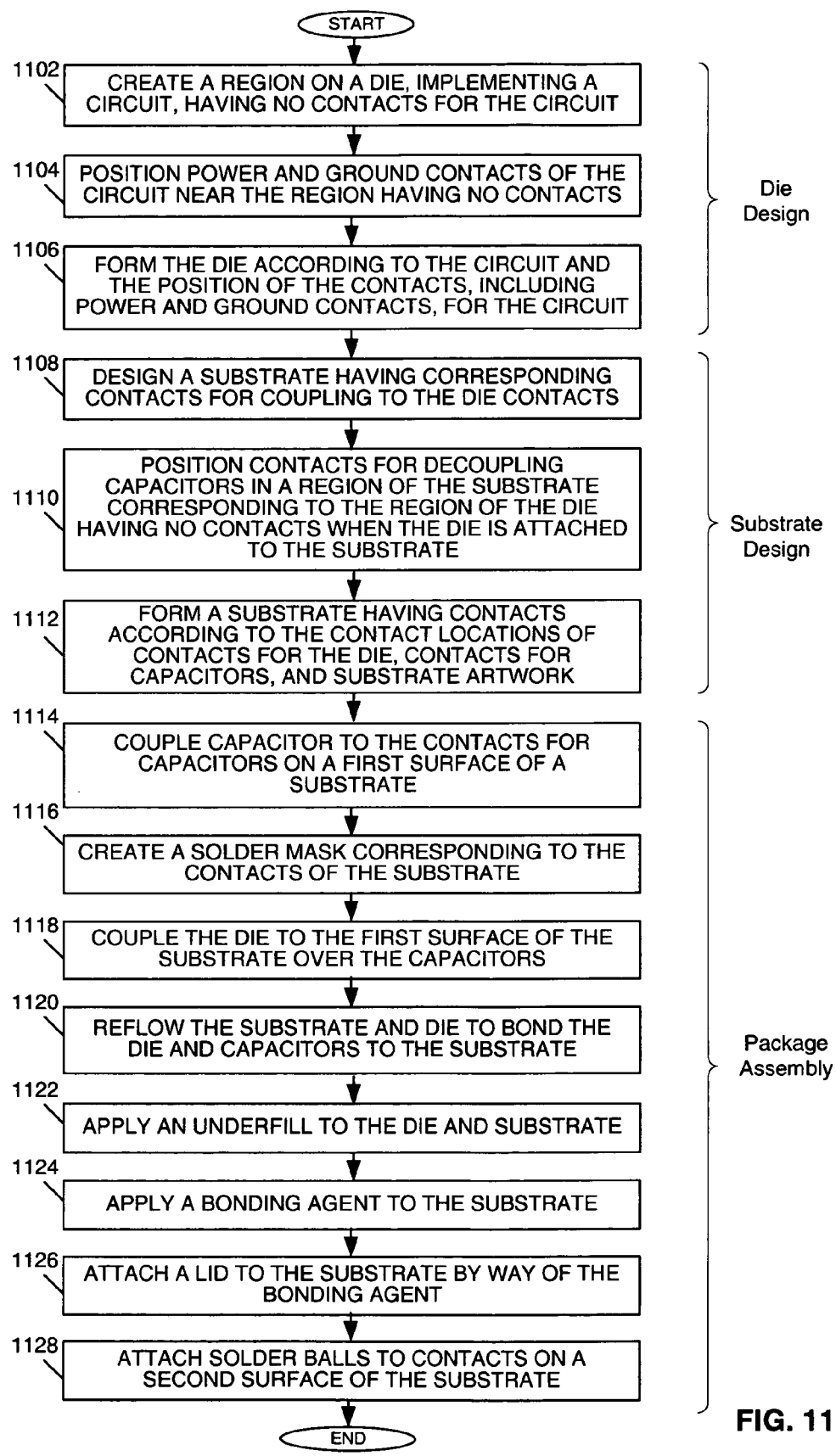
FIG. 11 is a flow chart showing a method of implementing a capacitor in an integrated circuit according to an embodiment the present invention.

Turning now to FIG. 11, a flow chart shows a method of implementing a capacitor in an integrated circuit according to an embodiment the present invention. The method of FIG. 11 may be used to create the integrated circuit packages of FIG. 5 or 6, for example, or some other integrated circuit package. According to one aspect of the method, the design of the integrated circuit package requires consideration of the implementation of a circuit on the integrated circuit die, the layout of the substrate, and the assembly of the integrated circuit package. Each of the various considerations will be described. A region on a die which implements a circuit is created having no contacts for the circuit at a step 1102. Power and ground contacts of the circuit are positioned near the region of the die having no contacts at a step 1104. The die is formed according to the circuit and the position of the contacts, including power and ground contacts, for the circuit at a step 1106.

A substrate is designed having corresponding contacts for coupling to the contacts of the die at a step 1108. Contacts for decoupling capacitors are positioned in a region of the substrate corresponding to the region of the die having no contacts when the die is attached to the substrate at a step 1110. A substrate having contacts according to the contact locations of contacts for the die, contacts for capacitors, and substrate artwork is formed at a step 1112.

A capacitor is coupled to the contacts for capacitors on a first surface of a substrate at a step 1114. A solder mask corresponding to the contacts of the substrate is created at a step 1116. Alternatively, the solder mask could be applied before the capacitors are attached to the substrate, as described above in reference to FIG. 6. The die is coupled to the first surface of the substrate over the capacitors at a step 1118. The solder is reflowed to bond the die and capacitors to the substrate at a step 1120. An underfill is applied to the die and substrate at a step 1122. A bonding agent is applied to the substrate and/or die at a step 1124. A lid is attached to the substrate by way of the bonding agent at a step 1126. Solder balls are attached to contacts on a second surface of the substrate at a step 1128.

The circuits and methods described above provide a number of advantages over conventional designs. For example, the positioning of decoupling capacitors under the die provides better electrical performance due to shorter conductive paths between the decoupling capacitors and the power/ground bumps of the integrated circuit die. Because the top layer substrate design and solder mask openings are created based upon the layout of the integrated circuit die so that the chip capacitors are placed near power and ground contacts of the integrated circuit die, the simultaneous switching noise (SSO) between the power & ground planes is minimized compared to designs. By using high-Pb solder bumps, an increased stand-off height over eutectic bumps is achieved. That is, since high-Pb bumps do not melt during assembly reflow process, a separation is maintained between the integrated circuit die and the capacitors on the substrate. Accordingly, the capacitors are protected during the entire package assembly process and the board mount process. The circuits and methods also provide an improved packaging efficiency by removing the capacitors from periphery of the substrate, thus allowing increased area for attaching the lid to the substrate or reducing the overall size of the integrated circuit package.

It can therefore be appreciated that the new and novel circuit for and method of implementing a capacitor on an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit package comprising:
a substrate extending from a first end to a second end and having a plurality of conductors and a plurality of contact pads, each conductor providing a connection from a predetermined contact pad of said plurality of contact pads on a first surface for receiving components of said integrated circuit package extending from said first end to said second end of said substrate to a first predetermined contact pad of said plurality of contact pads on a second surface of said substrate opposite said first surface, wherein said first surface for receiving components of said integrated circuit package comprises a planar surface;
a discrete capacitor coupled to a first contact pad and a second contact pad of said plurality of contact pads on said first surface of said substrate, said first contact pad on said first surface being coupled to a second predetermined contact pad of said plurality of contact pads on said second surface of said substrate;

an integrated circuit die directly bonded to said first surface of said substrate over said discrete capacitor by a plurality of solder bumps comprising a first region of solder bumps and a second region of solder bumps, said integrated circuit die having a bus in a region above said discrete capacitor and between said first region of solder bumps and said second region of solder bumps, wherein said region above said discrete capacitor has no solder bumps, and wherein each of said first region and said second region of solder bumps comprises rows and columns of solder bumps and said bus extends in said region above said discrete capacitor having no solder bumps between a column of solder bumps of said first region and a column of said solder bumps of said second region along a plurality of rows of said first region and a plurality of rows of said second region; and a lid coupled to said substrate, said lid encapsulating said integrated circuit die and said discrete capacitor.

2. The integrated circuit package of claim 1 further comprising a solder mask on said substrate, said solder mask covering said discrete capacitor.

3. The integrated circuit package of claim 1 wherein said integrated circuit die is implemented as a flip chip die having a surface adjacent to said substrate comprising contact pads of said flip chip die for receiving said plurality of solder bumps, wherein a region of said surface adjacent to said substrate of said flip chip die has no solder bumps.

4. The integrated circuit package of claim 3 wherein said substrate comprises capacitor contact pads of said plurality of contact pads on said first surface for receiving said discrete capacitor in a region of said substrate corresponding to said region of said surface adjacent to said substrate of said flip chip die with no solder bumps when said flip chip die is coupled to said substrate.

5. The integrated circuit package of claim 4 wherein said capacitor contact pads for receiving said discrete capacitor are positioned near a power contact pad or a ground contact pad of said substrate.

6. An integrated circuit package comprising:
a substrate extending from a first end to a second end and having a plurality of contact pads;
an integrated circuit die implemented as a flip chip die directly bonded to contact pads of said plurality of contact pads on a first surface of said substrate for receiving said integrated circuit die extending from said first end to said second end of said substrate and having a first region comprising a first plurality of solder bumps and a second region comprising a second plurality of solder bumps, said integrated circuit die having a power bus extending along said first region and said second region, wherein a region between said first region and said second region having said power bus has no solder bumps, wherein said first surface of said substrate for receiving said integrated circuit die comprises a planar surface, and wherein each of said first region and said second region comprises rows and columns of solder bumps and said bus extends in said region between said first region and said second region and between a column of solder bumps of said first region and a column of said solder bumps of said second region along a plurality of rows of said first region and a plurality of rows of said second region;
a discrete capacitor coupled to a first contact pad and a second contact pad of said plurality of contact pads on said first surface of said substrate between said first region and said second region, wherein said first contact pad of said plurality of contact pads is coupled to a third contact pad of said plurality of contact pads on said first surface of said substrate and said second contact pad of said plurality of contact pads is coupled to a fourth contact pad of said plurality of contact pads for receiving a solder ball of said integrated circuit package on a second surface of said substrate opposite said first surface; and
a lid coupled to said substrate, said lid encapsulating said integrated circuit die and said discrete capacitor.

7. The integrated circuit package of claim 6 wherein said second contact pad of said plurality of contact pads is coupled to said fourth contact pad for receiving a solder ball said integrated circuit package through a conductor extending from said first surface of said substrate to said second surface of said substrate.

8. The integrated circuit package of claim 6 wherein said power bus extends in a first direction along said integrated circuit die.

9. The integrated circuit package of claim 8 further comprising a plurality of conductors coupled to said power bus and extending in a second direction.

10. The integrated circuit package of claim 8 further comprising a ground bus extending in said first direction.

11. The integrated circuit package of claim 10 further comprising a plurality of conductors coupled to said ground bus and extending in a second direction.

12. The integrated circuit package of claim 11 further comprising a second discrete capacitor coupled to a ground contact pad for said integrated circuit die.

13. The integrated circuit package of claim 6 wherein said integrated circuit die implements circuits of a programmable logic device.

14. An integrated circuit package comprising:
a substrate extending from a first end to a second end and having a plurality of conductors and a plurality of contact pads, said plurality of conductors comprising a first conductor providing a first connection between a power contact pad of said plurality of contact pads on a first surface of said substrate for receiving components of said integrated circuit package extending from said first end to said second end of said substrate and a first predetermined contact pad of said plurality of contact pads on a second surface of said substrate opposite said first surface and a second conductor providing a second connection between a ground contact pad of said plurality of contact pads on said first surface of said substrate and a second predetermined contact pad of said plurality of contact pads on said second surface of said substrate, wherein said first surface for receiving components of said integrated circuit package comprises a planar surface;
an integrated circuit die directly bonded to contact pads of said plurality of contact pads on said first surface of said substrate and having a first region comprising a first plurality of solder bumps and a second region comprising a second plurality of solder bumps, said integrated circuit die having a power bus and a ground bus extending along said integrated circuit die between said first region and said second region, wherein a region between said first region and said second region having said power bus and said ground bus has no solder bumps, and wherein each of said first region and said second region comprises rows and columns of solder bumps and said power bus and said ground bus extend in said region between said first region and said second region and between a column of solder bumps of said first region and a column of said solder bumps of said second region along a plurality of rows of said first region and a plurality of said second region;

a first discrete capacitor coupled to said power contact pad on said first surface of said substrate between said first region and said second region;

a second discrete capacitor coupled to said ground contact pad on said first surface of said substrate between said first region and said second region; and a lid coupled to said substrate, said lid encapsulating said integrated circuit die and said first and second discrete capacitors.

15. The integrated circuit package of claim 14 wherein said first discrete capacitor is coupled to said power contact pad through a third conductor in said substrate.

16. The integrated circuit package of claim 14 wherein said second discrete capacitor is coupled to said ground contact pad through a third conductor in said substrate.

17. The integrated circuit package of claim 14 wherein said power bus extends in a first direction, said integrated circuit package further comprising power conductors extending from said power bus to route a power signal to said integrated circuit die away from said power bus.

18. The integrated circuit package of claim 14 wherein said ground bus extends in a first direction, said integrated circuit package further comprising ground conductors extending from said ground bus to route a ground signal to said integrated circuit die away from said power bus.

19. The integrated circuit package of claim 14 wherein said integrated circuit die is implemented as a flip chip die having a surface adjacent to said substrate comprising contact pads for receiving said first plurality of solder bumps and said second plurality of solder bumps, wherein a region of said surface comprising contact pads of said flip chip die has no solder bumps.

20. The integrated circuit package of claim 19 wherein said substrate comprises contact pads of said plurality of contact pads on said first surface for receiving said first discrete capacitor and said second discrete capacitor in a region of said substrate corresponding to said region of said surface comprising contact pads of said flip chip die with no solder bumps when said flip chip die is coupled to said substrate.

* * * * *